US008513989B1

(12) United States Patent  (10) Patent No.: US 8,513,989 B1
Martin et al.  (45) Date of Patent: Aug. 20, 2013

(54) INTEGRATED CIRCUIT, MICRO-CONTROLLER UNIT, AND METHOD INCLUDING A SYNCHRONOUS SAMPLING CONTROLLER

(75) Inventors: Bradley Martin, Austin, TX (US); Thomas Saroshan David, Austin, TX (US); Alan Lee Westwick, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/407,708

(22) Filed: Feb. 28, 2012

(51) Int. Cl.
*H03L 7/06* (2006.01)
(52) U.S. Cl.
USPC ............ 327/148; 327/146; 327/159; 327/156
(58) Field of Classification Search
USPC ................. 327/141, 144–163; 375/373–376; 331/1 A, 15–17
See application file for complete search history.

(56) References Cited

U.S. PATENT DOCUMENTS

| 7,382,202 B2* | 6/2008 | Jaffe et al. ................. 331/18 |
| 2009/0237119 A1* | 9/2009 | Tomisato ................. 327/82 |
| 2010/0266067 A1* | 10/2010 | Eitel ................. 375/324 |

* cited by examiner

*Primary Examiner* — Lincoln Donovan
*Assistant Examiner* — Brandon S Cole
(74) *Attorney, Agent, or Firm* — Cesari & Reed LLP; R. Michael Reed

(57) ABSTRACT

A micro-controller unit (MCU) includes an analog-to-digital converter (ADC) including an input, a timing input, and an output. The input of the ADC is configurable to couple to an output of a peripheral module. The MCU further includes a synchronous sampling controller configured to provide a clock signal to a clock output terminal configurable to couple to a clock input of the peripheral module. The synchronous sampling controller is further configured to provide a timing signal to the timing input of the ADC to synchronize sampling of a signal at the input of the ADC to timing of the peripheral module.

20 Claims, 4 Drawing Sheets

INTEGRATED CIRCUIT, MICRO-CONTROLLER UNIT, AND METHOD INCLUDING A SYNCHRONOUS SAMPLING CONTROLLER

FIELD

This disclosure relates generally to integrated circuits that are configured to connect to one or more peripheral circuits, and more particularly to integrated circuits that control synchronous operation of one or more peripheral circuits.

BACKGROUND

An integrated circuit including a micro-controller unit (MCU) can be configured to couple to multiple external signal sources, such as scanners, video cameras, audio input devices, sensors, and other data sources. Control of clocked external signal sources that provide input to an analog-to-digital converter (ADC) often includes logic circuitry, typically external to the MCU, along with internal timers and counters. Configuration of such logic circuitry uses additional input/output (I/O) and control functions in the MCU, including interrupts, clocking, and the like.

SUMMARY

In an embodiment, a micro-controller unit (MCU) includes an analog-to-digital converter (ADC) including an input, a timing input, and an output. The input of the ADC is configurable to couple to an output of a peripheral module. The MCU further includes a synchronous sampling controller configured to provide a clock signal to a clock output terminal configurable to couple to a clock input of the peripheral module. The synchronous sampling controller is further configured to provide a timing signal to the timing input of the ADC to synchronize sampling of a signal at the input of the ADC to timing of the peripheral module.

In another embodiment, an integrated circuit includes a first analog-to-digital converter (ADC) configured to receive a first signal from a first source and a second ADC configured to receive a second signal from a second source. The integrated circuit further includes a synchronous sampling generator configured to provide a timing signal to synchronize the first and second ADCs to perform synchronized sampling of the first and second signals.

In still another embodiment, a method includes receiving a first data signal at a first input terminal of a circuit, receiving a second data signal at a second input terminal of the circuit, and providing a first pixel clock signal to a timing input of a first analog-to-digital converter (ADC) using a synchronous sampling controller. The method further includes providing a second pixel clock signal to a timing input of a second ADC using the synchronous sampling controller. The first and second pixel clock signals synchronize sample timing of the first and second ADCs.

BRIEF DESCRIPTION OF THE DRAWINGS

In the following description, the use of the same reference numerals in different drawings indicates similar or identical items.

DETAILED DESCRIPTION OF ILLUSTRATIVE EMBODIMENTS

Embodiments of a circuit are disclosed that includes an MCU and that utilizes a synchronous sampling generator (SSG or synchronous sampling controller) to synchronize an ADC to timing of peripheral devices coupled to the circuit. The SSG is tightly coupled with the ADC's state logic, resulting in improved performance in terms of the effective speed, reduced latency, and ease of use. In many applications, the SSG can synchronize the integrated circuit and external peripherals without external logic circuitry. Further, the SSG also makes it possible to synchronize the integrated circuit to timing of external peripherals without extra input/output (I/O) pins, interrupt mechanisms, and/or clock sources, which might otherwise be used to provide such functionality. Further, the SSG eliminates external logic circuitry for synchronizing sampling operations among multiple converters by using a multi-phase clock, performing a pre-determined number of sample generations and conversions, mixing automated sampling operations with MCU-control operations, and synchronizing multiple types of signal converters and generators. An example of a system including an integrated circuit having an SSG is described below with respect to FIG. 1.

Figure 1:
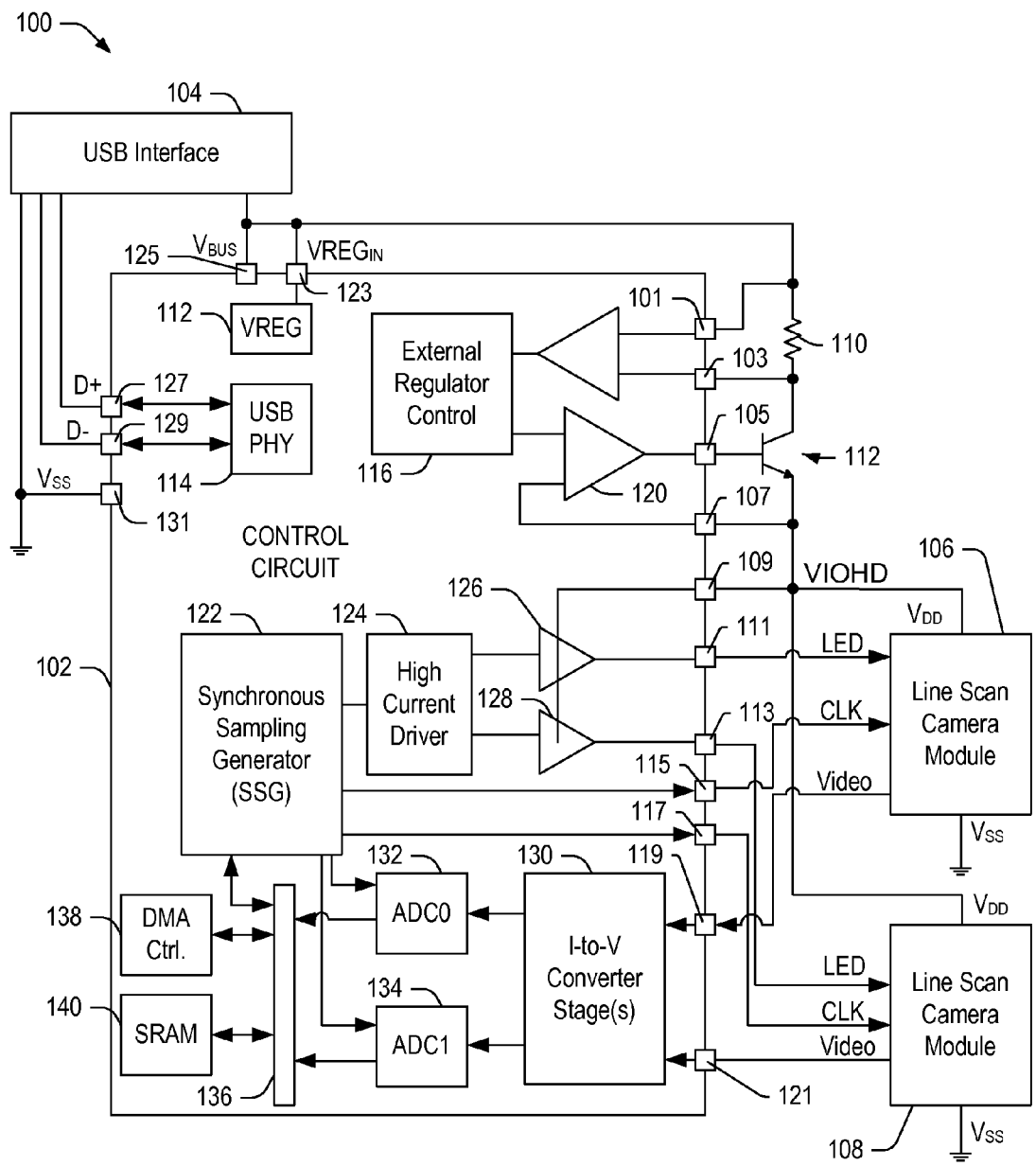
FIG. 1 is block diagram of a system having a control circuit including a synchronous sampling generator and coupled to multiple peripheral circuits.

FIG. 1 is block diagram of a system 100 that has a control circuit 102 including a synchronous sampling generator 122 where control circuit 102 is coupled to multiple peripheral circuits, such as line scan camera modules 106 and 108. Line scan camera modules 106 and 108 are illustrative examples of peripheral devices that can be used in conjunction with circuit 102. In other embodiments, one or more of the camera modules 106 and 108 can be omitted and/or replaced with other devices or circuits.

Control circuit 102 includes multiple terminals or pads 123, 125, 127, 129, and 131 for coupling the integrated circuit 102 to a universal serial bus (USB) interface 104, which may be coupled to a peripheral device or to a host system. Pad 131 is coupled to ground, and pads 123 and 125 are coupled to a voltage bus. Pads 127 and 129 are coupled to physical transport lines of USB interface 104. Control circuit 102 further includes pads 101, 103, 105, 107, 109, 111, 113, 115, 117, 119, and 121. System 100 further includes a resistor 110 including a first terminal coupled to pad 101, and a second terminal coupled to pad 103. System 100 further includes a transistor 112 including a first electrode coupled to pad 103, a control terminal coupled to pad 105, and a second electrode coupled to pad 107.

Line scan camera module 106 includes a supply input coupled to pad 109 and 107, an LED control input coupled to pad 111, and a clock input coupled to pad 115. Line scan camera module 106 further includes a video output coupled to pad 119. Line scan camera module 108 includes a supply input coupled to pad 109 and 107, an LED control input coupled to pad 113, and a clock input coupled to pad 117. Line scan camera module 108 further includes a video output coupled to pad 121.

Control circuit 102 includes a voltage regulator 112 coupled to pad 123 and is configured to provide a regulated voltage to on-chip circuitry. Control circuit 102 further includes a USB physical layer circuit 114 coupled to pads 127 and 129. USB physical layer circuit 114 communicates data to and from control circuit 102 to USB interface 104. Control circuit 102 also includes an external regulator control 116 having an input coupled to an output of a differential amplifier 118, which has a first input coupled to pad 101 and a second input coupled to pad 103. External regulator control 116 further includes an output coupled to an input of a differential amplifier 120, which has a second input coupled to pad 107 and an output coupled to pad 105.

Control circuit 102 further includes a synchronous sampling generator (SSG) 122 including outputs coupled to pads 115 and 117 and to ADCs 132 and 134. SSG 122 further includes an input/output coupled to a high current driver 124. High current driver 124 including a first output coupled to driver 126, which has a power input coupled to pad 109 and an output coupled to pad 111. High current driver 124 includes a second output coupled to driver 128, which has a power input coupled to pad 109 and an output coupled to pad 113. Control circuit 102 also includes a current-to-voltage (I-to-V) converter stages circuit 130 having inputs coupled to pads 119 and 121 and outputs coupled to ADC circuits 132 and 134. ADC 132 includes a timing control input coupled to an output of SSG 122 for receiving a phase-delayed timing signal. ADC 134 also includes a timing control input coupled to an output of SSG 122 for receiving a phase-delayed timings signal. Each of ADCs 132 and 134 includes an output coupled to an advanced peripheral bus (APB) 136, which is coupled to SSG 122. APB 136 is also coupled to a direct memory access (DMA) controller 138 and to a static random access memory (SRAM) 140.

In an example, high current drivers 124 provide current to drivers 126 and 128, which drive signals onto pads 111 and 113, respectively. Driver 126 drives a light emitting diode (LED) driver signal to pad 111 and to line scan camera module 106. Driver 128 drives an LED driver signal to pad 113 and to line scan camera module 108. SSG 122 controls sample timing of ADCs 132 and 134 to perform synchronized interleaved sampling. SSG 122 further includes logic for generating a clock signal for external devices or peripheral modules, such as line scan camera modules 106 and 108, which clock signal is provide to pads 115 and 117 and which is synchronized to the internal sampling clock used by one or both ADCs 132 and 134. In a particular embodiment, SSG 122 controls ADCs 132 and 134 to perform interleaved sampling of the same input, which can provide a sample rate of twice that of each individual ADC 132 or 134. For example, in an implementation where ADCs 132 and 134 are capable of one mega-sample per second (MSPS) rates, SSG 122 can control ADCs 132 and 134 to perform interleaved, 2 MSPS sampling of the same input. An example of an embodiment of SSG 122 is described below with respect to FIG. 2.

Figure 2:
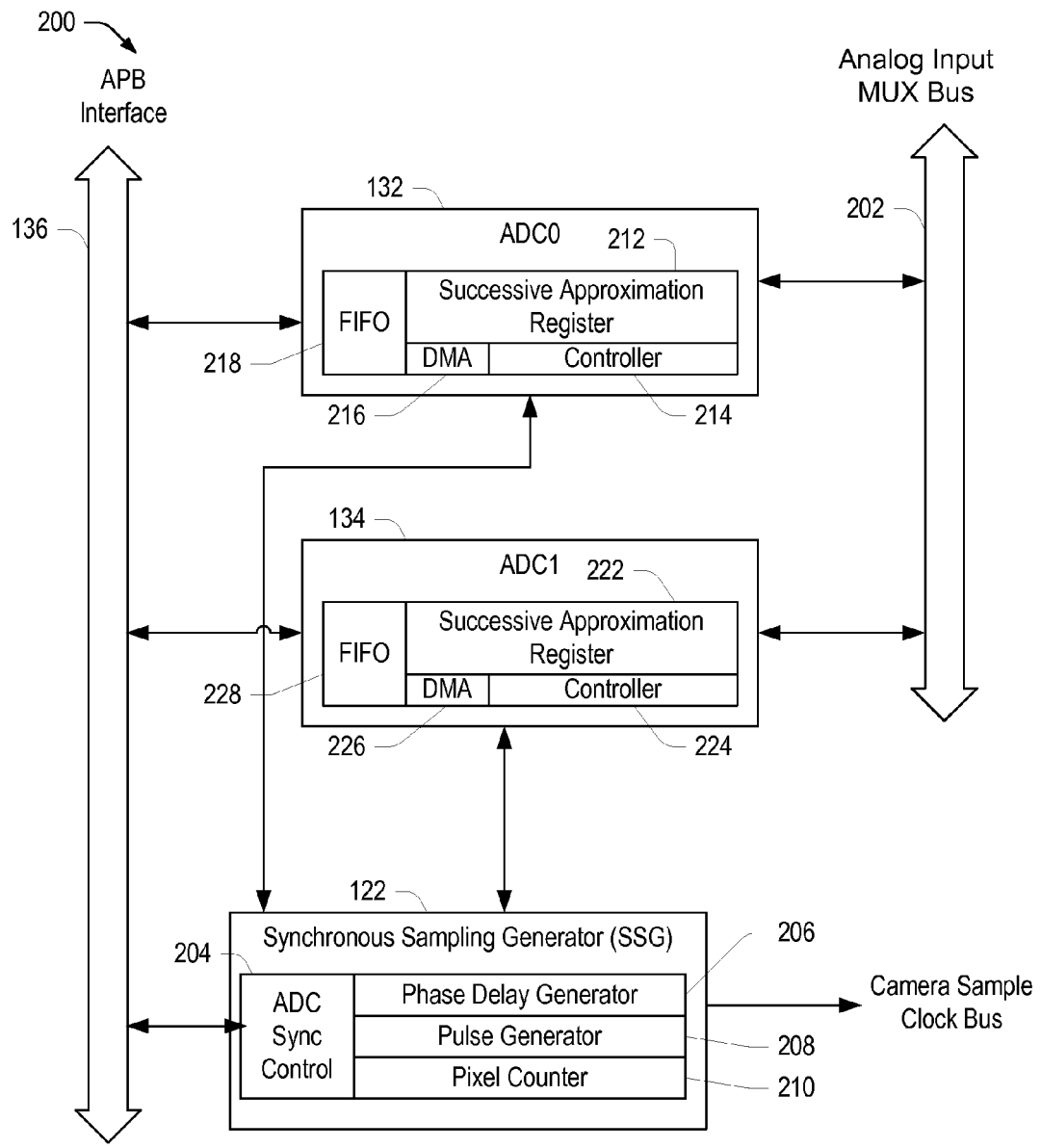
FIG. 2 is a block diagram of a portion of the integrated circuit of FIG. 1 illustrating functional blocks of the synchronous sampling generator.

FIG. 2 is a block diagram of a portion 200 of the control circuit 102 of FIG. 1 illustrating functional blocks of SSG 122. Portion 200 includes APB 136 coupled to ADCs 132 and 134 and to SSG 122. Further, portion 200 includes an analog input multiplexer bus 202, which is coupled to inputs of ADCs 132 and 134. In the example of FIG. 1, current-to-voltage converter 130 provided the input to ADCs 132 and 134; however, in this example, the input voltages may be multiplexed and provided to the inputs of ADCs 132 and 134. In this instance, ADC 132 includes a successive approximation register (SAR) 212, a controller 214, a direct memory access (DMA) controller 216, and a first-input-first-output (FIFO) register 218. ADC 134 includes a SAR 222, a controller 224, a DMA controller 226, and a FIFO register 228. SARs 212 and 222 operate under the control of controllers 214 and 224, respectively, and convert continuous analog waveforms into discrete digital representations. The digital representations can be stored in FIFO registers 218 and 228 and written directly to a memory location in SRAM 140 or another memory via APB 136.

SSG 122 includes a pulse generator 208 for providing a pixel clock signal synchronized using an ADC synchronization controller 204 to synchronize the ADC capture/convert operations. While FIG. 1 depicts line scan camera modules 106 and 108, the term "pixel clock signal" is not restricted to camera applications. Instead, the term "pixel clock signal" refers to a clock signal that may be different from the clock pulses provided to the peripheral devices and can be used with any system that generates a sequence of voltage or current values in response to the clock signal. SSG 122 further includes a phase delay generator 206 and a pixel counter 210. SSG 122 generates a clock signal that can be provided to an external device, such as a camera via pad 115 (for example). SSG 122 can also generate a pixel "clock" signal that is provided to ADC 132 and/or ADC 134 that is optionally phase delayed based on signals from phase delay generator 206. The pixel clock signal controls sample timing of ADCs 132 and 134 to sample pixel values from line scan camera modules 106 and 108. In an example, phase delay generator 206 is configurable to divide the clock phase of signals produced by pulse generator into 16 discrete phases, which can be configured to delay the clock signal. In an example, the peripheral device has a canonical number of bits, and pixel counter 210 is used to count the pulses such that SSG 122 knows when ADCs 132 and 134 have sampled the number of pixels scanned by line scan camera modules 106 and 108.

In this example, the clock signal provided by SSG 122 to ADCs 132 and 134 is a pixel clock signal synchronized to the ADC capture/convert cycle. Phase delay generator 208 provides a programmable delay time between the pixel clock edge (as generated by pulse generator 208) and the ADC conversion-start event. SAR synchronization control 204 uses phase delay generator 206 to provide different data transfer timing for each of ADCs 132 and 134, which data transfer timing can correspond to the transfer timing of the corresponding peripheral device. In an example, pulse generator 208 and clock control lines coupling SSG 122 to ADCs 132 and 134 can be controlled by instructions executed by an MCU, so that control signaling can be performed during times when data is not being sampled. By providing DMA controllers 216 and 226, ADCs 132 and 134 can provide efficient, low-overhead data transfer from ADCs 132 and 134 to memory.

In an embodiment, SSG 122 has a programmable threshold for determining the number of sample clocks per frame of data transferred by the peripheral device. SSG 122 can compare the count of pixel counter 210 to the programmable threshold (frame threshold) to determine when the data transfer is complete (i.e., when the end of a frame is reached). In one instance, the number of sample clocks per frame is variable over a wide range of frame sizes, up to, for example, 4096 pixels, allowing SSG 122 to operate with a wide array of sensors.

Pulse generator 208 is not frequency-critical. In one instance, pulse generator 208 operates at a high enough frequency to operate ADCs 132 and 134 at their maximum sampling rates, such as one pixel clock cycle/conversion per pixel. The clock rate for control operations may also be frequency-independent. In some systems, the amount of non-pixel-clock signaling per frame between SSG 122 and ADCs 132 and 134 (after initial setup) can be very low, such as a few bits sent before and after a complete frame transfer. Further, SSG 122 can reduce power to pulse generator 206 so that the pixel clock can be quiescent when the peripheral device is not in use.

In an example, stream-processing of pixel data by ADCs 132 and 134 is preceded by a series of operations, including a sensor reset operation, dark-level sensing, active adjustment, illumination control, and other operations that can vary with each particular peripheral device.

Figure 3:
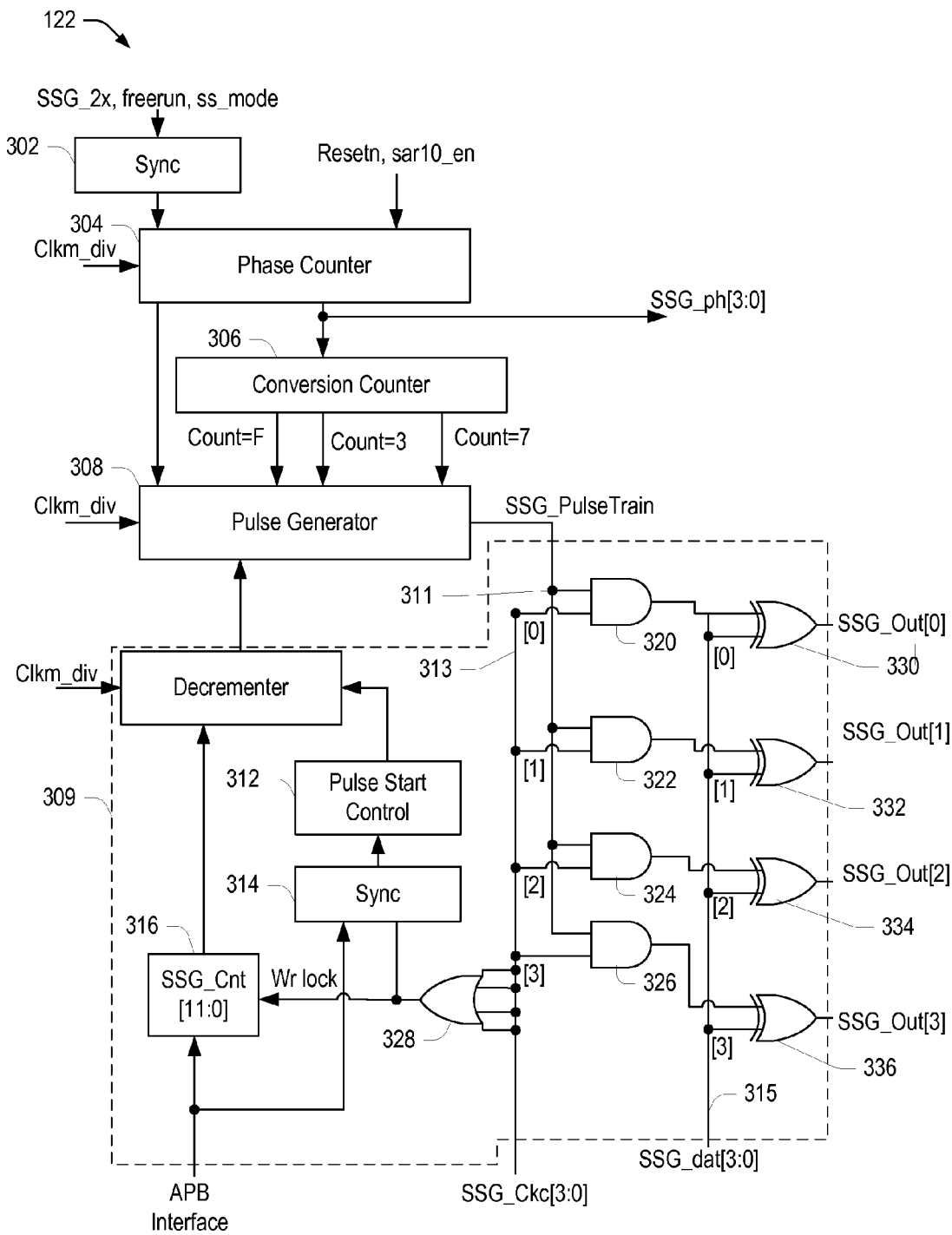
FIG. 3 is a logic diagram of an exemplary embodiment of a synchronous sampling generator.

FIG. 3 is a partial block diagram and partial logic diagram of an exemplary embodiment of SSG 122, which is implemented as a state machine. SSG 122 includes a synchronization register 302 including an input for receiving a mode control signal, which specifies whether SSG 122 operates in a free run mode, a 1× mode or a 2× mode. SSG 122 further includes a phase counter 304, a conversion counter 306, a pulse generator 308, and a clock/control signal controller 309. Synchronization register 302 includes an output coupled to an input of phase counter 304, which is a 4-bit free running phase counter, clocked at the nominal clock speed by a clock signal (CLKm_DIV) supplied by the SSG 122. Phase counter 304 may be free-running or it may be programmed to generate a defined number of phase cycles. Because each phase cycle is typically used to start a conversion, the number of phase cycles is equal to the number of conversions that are performed by an ADC, such as ADC 132 or 134, under the control of SSG 122 in a defined set of cycles. In one example, phase counter 304 is clocked at approximately 16 MHz. Counting-up from zero, phase counter 304 marks sixteen equally-spaced-in-time events each microsecond for one or two ADCs 132 and 134, and provides the equally-spaced-in-time events via a four-bit phase signal (SSG_ph[3:0]). SSG 122 further includes a conversion counter 306, which operates as a 12-bit, programmable up-counter. Loaded at the start of a series of conversions, conversion counter 306 increments once each time the phase counter 304 overflows. At each count (and once at zero), a sample cycle start can be generated by the SSG 122 and sent to the ADCs 132 and 134. Conversion counter 306 provides an output to pulse generator 308. Pulse generator 308 includes an input coupled to synchronization register 302 and an input coupled to clock/control signal controller 309. Pulse generator 308 includes an output coupled to a node 311.

SSG 122 further includes clock/control signal controller 309 including AND gates 320, 322, 324, and 326 and exclusive-OR gates 330, 332, 334, and 336. Each AND gate 320, 322, 324, and 326 includes a first input coupled to node 311, a second input coupled to node 313, and an output. Each exclusive-OR gate 330, 332, 334, and 336 includes a first input coupled to the output of one of AND gates 320, 322, 324, and 326 and a second input coupled to a node 315. The output of AND gate 320 is coupled to the first input of exclusive-OR gate 330. The output of AND gate 322 is coupled to the first input of exclusive-OR gate 332. The output of AND gate 324 is coupled to the first input of exclusive-OR gate 334. The output of AND gate 326 is coupled to the first input of exclusive-OR gate 336.

Clock/control signal controller 309 further includes an OR gate 328 including multiple inputs coupled to node 313 and an output coupled to an input of synchronization circuit 314 and to a control input of a "pixel count" register 316. Synchronization circuit 314 and "pixel count" register 316 include an input coupled to an APB interface. Synchronization circuit 314 includes an output coupled to pulse start control circuit 312, which has an output coupled to a control input of a decrementer circuit 310. Decrementer 310 includes a clock input for receiving a pixel clock signal (CLKm_div), an input coupled to the output of "pixel count" register 316, and an output coupled to pulse generator 308. In a "1×" mode, decrementer 310 decrements a count with each pixel clock pulse. In a "2×" mode, decrementer 310 decrements the count with every second pixel clock pulse (i.e., pixel clock pulses occur at two times the decrement rate).

In an example, programmable pulse generator 308 creates a 50% duty cycle pulse once at each count (and once at zero) after the conversion counter 306 is triggered. Clock/control signal generator 309 provides register-driven logic allowing software to control the operation of four outputs (SSG_Out[0], SSG_Out[1], SSG_Out[2], and SSG_Out[3]) from the SSG 122 to external devices. Clock/control signal generator 309 allows the register settings to define whether (or not) the output is driven by the pulse generator 308, to set the polarity of the pulses (via exclusive-OR gates 330, 332, 334, and 336), and to set the output level of the four outputs when the pulse generator 308 is not running so that the outputs are not floating.

In one possible implementation, SSG 112 is coupled to a non-contact location sensing system or non-contact sensor. In an example, such a non-contact location sensing system or non-contact sensor can utilize linear image sensors to detect the location of an object. In an example, the linear image sensor is a linear array of photocells (1×256, 1×512, . . . , 1×4096). Each photocell generates a voltage or current proportional to the incident light received during a period of light integration (shutter open). The collected voltages or currents are then serially transmitted to an ADC, such as ADC 132 or 134 for conversion to digital form. Linear image sensors are used in applications such as page scanning, facsimile, optical carriage recognition (OCR), bar-code reading, position detection and decoding, spectroscopy and contact imaging, and other high-rate sampled-data systems. Typically, direct control of linear image sensors varies with each sensor. By utilizing firmware to perform much of the detailed sensor configuration, the circuit is flexible with respect to options for connecting a wide range of synchronously sampled sensors to ADCs 132 and 134.

SSG 122 makes it possible to connect multiple ADCs (such as ADCs 132 and 134) together to perform synchronized interleaved sampling. Further, SSG 122 can output a clock signal to pins for use by external devices (such as pads 115 and 117 in FIG. 1), where the clock signal is synchronized to the internal sampling clock (pixel clock) used by any number of ADCs 132 and 134.

In operation, SSG 122 generates a time-base for synchronizing an external sample source with one or more ADCs 132 and 134. The time-base rate is programmable, and its maximum cycle time is equal to the highest sample rate of ADC 132 or 134. Each cycle time is broken into sixteen time slots using phase counter 304. The start of each cycle is marked for external reference by a pulse, available at the device pins. SSG 122 provides each ADC 132 and 134 with clock phase timing signals (CLKm_div). Each ADC 132 and 134 may be programmed to trigger its conversion operation based on any of the sixteen possible phases.

Typically, the external reference pulse is used by an external data source to clock-out analog samples for input to ADCs 132 and 134. The external source's dwell time (the delay between the start of the pulse and the accurate settling of the analog sample it supplies to the ADC 132 or 134) determines which phase number is programmed into a ADC 132 or 134 for its conversion start time.

Pulse generator 308 creates a square wave pulse (optional polarity) that is available at the device pins or pads 115 and 117. In one example, pulse generator 308 operates on a timing signal supplied by ADC 132. If the timing signal is not running, the clocking function of SSG 122 will not operate, but the peripheral bus registers and the output data control functions (ssg_dat) on node 315 can still be used. In an example, enabling the ADC 132 also turns on the timing signal to the SSG 122. Typically, if there are no SAR data conversions taking place, the generator performs no clocking functions.

In a particular example, ADCs 132 and 134 can be configured so that their start-of-conversion times are controlled by a phase in the sequence of SSG-generated phases from phase generator 304. Multiple ADCs, such as ADCs 132 and 134, can be synchronized in this manner, either to begin conversion at the same moment or at times offset from each other (if each ADC is programmed to start its conversion on a different phase).

In an example, SSG 122 generates an external sample data (pixel) clock that is synchronous to conversion operations of ADCs 132 and 134. SSG 122 includes a simple state machine for controlling up to four sensor channels, providing control of four linear image sensors, or two image sensors each having odd and even pixel data channels. ADCs 132 and 134 convert pixels at a rate of approximately 2M pixels per second (total). DMAs 216 and 226 can be used to transfer these samples from the ADCs 132 and 134 to memory during the frame acquisition period.

Pulse generator 308 produces a square-wave pulse train (or clock) that can be used as the pixel clock. Pulse generator 308 derives the pulses from the 16 MHz (nominal) SAR clock (clkm_div). Software executed by the MCU controls timing of the pulse generation and controls the delivery of the clock pulses to selected pins or pads. Pulse generator 308 provides the pixel clock signal at one of two frequencies: standard (1×) and fast (2×) (i.e., CLKm_div/16 or CLKm_dev/8). At the standard (1×) pixel clock rate, ADCs 132 or 134 converts one pixel voltage at a time (1 MSPS). In another example, two ADCs 132 and 134 can operate in parallel and can be connected to two sensors, and ADCs 132 and 134 convert two pixel voltages at a time (2 MSPS). At the 2× pixel clock rate (2 MHz), both ADCs 132 and 134 are configured to operate in interleaved mode to convert pixel voltages from a single sensor, at a rate of 2 MSPS. A register bit (ssg_2×) enables the 2× pixel clock rate. At the 2× pixel clock rate, if the "pixel count" register (ssg_cnt) 316 is used, its value equals one-half of the number of clock pulses generated.

In operation, each time pixel generator 308 generates a pulse, SSG 122 generates a cycle start signal to one or both ADCs 132 and/or 134 (depending on the mode). The timing of the ADC conversion start command is controlled internal to each ADC 132 and 134 by sampling time select bits, allowing the start of conversion to be delayed by a variable amount of time after the assertion of the pixel clock pulse, which allows ADC tracking to be optimally matched to the clocked external sensor. The value in register bits ssg_ph[3:0] (cleared at reset and ADC disabled) indicates the current state of the phase counter 304 sent to the ADCs 132 and 134 (as number of counts of the ADC timing clock, clkm_div).

The pixel clock generator creates four outputs, ssg_out[3:0]. These lines are distributed through a crossbar. The pixel clock is not driven onto the ssg_out[3:0] lines unless a register bit (ssg_ckc[3:0]) is set. Setting any of the ssg_ckc register bits at node 315 causes pulse generator 308 to begin a frame sequence of pulses. Setting any of the ssg_ckc bits while a frame sequence is already in progress has no effect on the operation of the pulse generator 308. At the end of a frame sequence, the ssg_ckc bits on node 315 are cleared in software (ssg_ckc[3:0]=4'h0), causing pulse generator 308 to return to the idle state. When the pulse generator 308 is not operating, or the clock is not enabled to drive the outputs, the clock signal to those outputs is low if the ssg_dat[3:0] bits are at logic low levels for that particular output. Otherwise, if the ssg_dat[3:0] bits are at a logic high level for the particular output, the quiescent level of the clock output is also high.

Software can control the state of ssg_out[3:0] lines via control bits (ssg_dat[3:0]), which bits invert the state of the lines. When ssg_out lines are quiescent, (pulse generator 308 is disabled), setting ssg_dat causes ssg_out to be driven high (clearing ssg_dat in this case causes ssg_out to then return to a low state). Leaving ssg_dat high while the pixel clock is enabled causes pulse generator 308 to be inverted, which allows for direct clocking of sensors requiring a negative-phase sampling clock.

When pulse generator 308 is enabled, it creates a programmed number of sequential conversion pulses, which can be referred to as a conversion "frame". A linear image sensor with 512 elements might be expected to require 512 pixel clock pulses per frame since a pulse is used to shift out a voltage sample for each element in the detector, but the number of required pulses may be larger or smaller depending on the number of white/dark/blocking/reference cells that may be clocked out for sampling. A 12-bit "pixel count" register (ssg_cnt[11:0]) 316 programs the number of pulses to be sent per frame, which can be set to the number of conversion minus one. For a single pulse, pixel count register 316 is set to zero, and for 4096 pulses, pixel count register 316 is set to FFF).

In general, the phase counter 304 divides the clock into 16 different phases for sampling, which makes it possible to select a sampling time that corresponds to a suitable point in the signal. For example, if the analog signal has a slope that resembles a signal having a resistive/capacitive time constant, it may be desirable to sample the analog signal closer to its peak value or its lowest value. An example of a timing diagram that depicts an analog waveform is described below with respect to FIG. 4.

Figure 4:
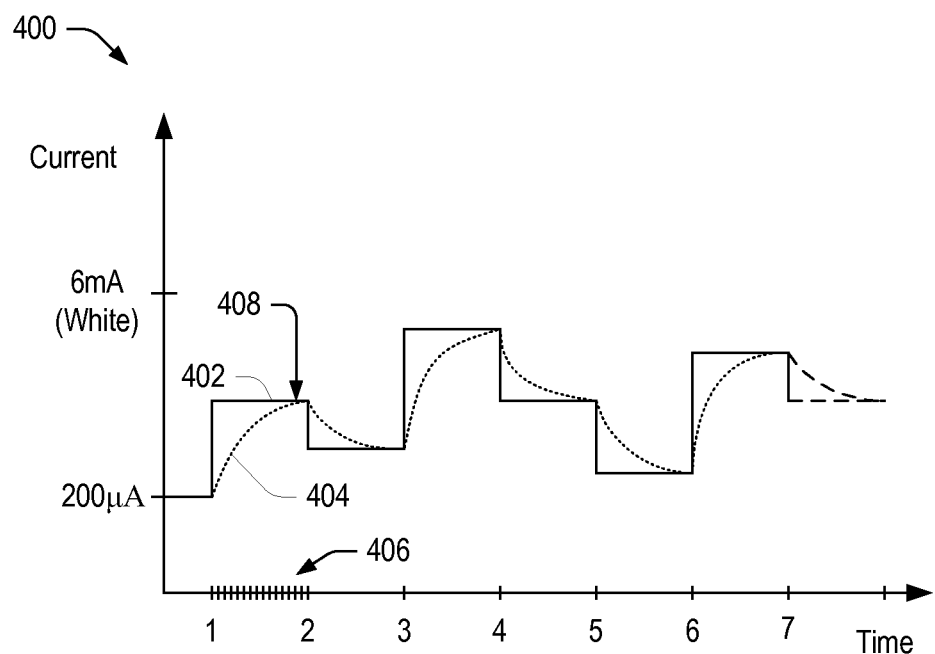
FIG. 4 is a timing diagram of a signal received by the integrated circuit of FIG. 1.

FIG. 4 is a timing diagram 400 of a signal received by the control circuit 102 of FIG. 1. Diagram 400 illustrates an ideal, square wave signal 402 that has an amplitude corresponding to a color value between black and white for each pixel of an array of pixels. Diagram 400 further illustrates an analog signal 404 that increases and decreases from pixel to pixel that has a slope resembling a resistive-capacitive time constant. Phase counter 304 makes it possible to divide the sample time for each frame so that the sample is taken at a point in time (such as generally indicated at 408), where the amplitude of the analog signal 404 is approximately at a local peak or local low level.

In one implementation, some peripheral devices, such as sensors (cameras), can have two shutter periods, one for ambient light and one for LED-illuminated conditions. In this implementation, the sensor can subtract the data from the two conditions internally, outputting the difference, or it can output both readings. In this example, control circuit 102 controls the sensor shutters coupled to control circuit 102 to turn on at the same time for the ambient sensing, and then controls the sensors' shutters to turn on sequentially for the illuminated reading. This sequential illumination uses a relatively long delay between the two shutter periods for all but the first sensor. In this example, control circuit 102 can utilize instructions executed by an MCU to control the shutter periods and sequential timing.

In a particular example, SSG 122 produces clock pulses at a frequency of approximately 1 MHz. In one example, about 550 pulses are used to sample the sensor data. For sensors with two shutter times, about 1100 pulses are used to sample the sensor data if the customer wants both ambient and illuminated data output from the sensor.

In conjunction with the circuits and methods described above with respect to FIGS. 1-4, a system is disclosed that includes one or more sensors coupled to a control circuit. The control circuit includes an SSG coupled to one or more pads for providing a clock signal and coupled to one or more ADCs to provide a pixel clock signal. The SSG provides a clock signal for clocking data from the sensors to input pins. Further, the SSG synchronizes the ADCs to the clock signal and sensor delays using pixel clock signal to control sampling of the sensor data.

Although the present invention has been described with reference to preferred embodiments, workers skilled in the art will recognize that changes may be made in form and detail without departing from the scope of the invention.

What is claimed is:

1. A micro-controller unit (MCU) comprising:
   an analog-to-digital converter (ADC) including an input, a timing input, and an output, the input configurable to couple to an output of a peripheral module; and
   a synchronous sampling controller configured to provide a clock signal to a clock output terminal configurable to couple to a clock input of the peripheral module, the synchronous sampling controller configured to provide a timing signal to the timing input of the ADC to synchronize sampling of a signal at the input of the ADC to timing of the peripheral module.

2. The MCU of claim 1, further comprising:
   a second ADC including an input to receive a second signal from a second peripheral module, a timing input coupled to the synchronous sampling generator and an output; and
   wherein the synchronous sampling controller controls timing of the ADC and the second ADC to perform synchronized interleaved sampling.

3. The MCU of claim 1, wherein the synchronous sampling controller comprises a pulse generator configured to provide a sequence of pulses representing a pixel clock operating at a selected frequency.

4. The MCU of claim 3, wherein the synchronous sampling generator provides the timing signal to the timing input of the ADC each time the pixel clock generates a pulse.

5. The MCU of claim 4, wherein the ADC includes sampling time select bits configurable to delay a start of a conversion by the ADC to match timing of the peripheral module.

6. The MCU of claim 3, wherein the pulse generator provides a programmed number of pulses corresponding to a number of sensor elements of the peripheral module.

7. An integrated circuit comprising:
   a first analog-to-digital converter (ADC) configured to receive a first signal from a first source;
   a second ADC configured to receive a second signal from a second source; and
   a synchronous sampling controller configured to provide a timing signal to synchronize the first and second ADCs to perform synchronized sampling of the first and second signals, the synchronous sampling controller further including at least one output terminal configurable to couple to at least one of the first source and the second source.

8. The integrated circuit of claim 7, wherein the synchronous sampling controller is configured to output a clock signal to the at least one output terminal, the clock signal synchronized to an internal sampling clock used by the first and second ADCs to sample the first and second signals, respectively.

9. The integrated circuit of claim 7, wherein the timing signal provides a time base to synchronize the first and second sources to the first and second ADCs.

10. The integrated circuit of claim 7, wherein the timing signal initiates a sampling operation.

11. The integrated circuit of claim 10, wherein:
    the first and second ADCs are programmable;
    the first ADC includes a first delay corresponding to one of a plurality of phases for delaying initiation of a conversion operation for a first period of time after receipt of the timing signal; and
    the second ADC includes a second delay corresponding to another of the plurality of phases for delaying initiation of the conversion operation for a second period of time after receipt of the timing signal.

12. The integrated circuit of claim 11, wherein the first period of time is equal to the second period of time.

13. The integrated circuit of claim 7, wherein the synchronous sampling controller comprises a phase counter that is clocked from a clock module of the first ADC, the phase counter configured to mark a pre-determined number of equally spaced events, each of the pre-determined number of equally spaced events representing a phase of the phase counter.

14. The integrated circuit of claim 13, wherein:
    the first ADC begins its conversion operation at a first selected phase of the phase counter; and
    the second ADC begins its conversion operation at a second selected phase of the phase counter.

15. The integrated circuit of claim 14, wherein the first selected phase and the second selected phase are offset from one another.

16. A method comprising:
    receiving a first data signal at a first input terminal of a circuit;
    receiving a second data signal at a second input terminal of the circuit;
    providing a first pixel clock signal to a timing input of a first analog-to-digital converter (ADC) using a synchronous sampling controller; and
    providing a second pixel clock signal to a timing input of a second ADC using the synchronous sampling controller;
    providing at least one of the first pixel clock signal and the second pixel clock signal to an output clock terminal configurable to couple to an external circuit that provides one of the first data signal and the second data signal; and
    wherein the first and second pixel clock signals synchronize sample timing of the first and second ADCs.

17. The method of claim 16, wherein the first and second ADCs comprise first and second successive approximation register ADCs.

18. The method of claim 16, further comprising:
    generating the first and second pixel clock signals using an ADC synchronization controller;
    counting a first number of pixels captured by the first ADC to detect;
    counting a second number of pixels captured by the second ADC; and
    detecting an end of a frame when one of the first and second numbers of pixels exceeds a frame threshold.

19. The method of claim 16, wherein providing the first and second pixel clock signals comprises controlling timing of transitions within the first and second pixel clock signals to control sample timing of the first and second ADCs to perform synchronized interleaved sampling of the first and second data signals.

20. The method of claim 16, wherein:
receiving the first data signal includes receiving a signal from a first non-contact sensor; and
receiving the second data signal includes receiving a signal from a second non-contact sensor.

* * * * *